(12) United States Patent
Kobayashi

(10) Patent No.: US 6,236,842 B1
(45) Date of Patent: May 22, 2001

(54) RADIO RECEIVER

(75) Inventor: Keija Kobayashi, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/046,227

(22) Filed: Mar. 23, 1998

(30) Foreign Application Priority Data

Mar. 28, 1997 (JP) .................................................. 9-078314

(51) Int. Cl.[7] .............................. H04B 1/06; H04B 7/00; H04B 1/18
(52) U.S. Cl. .................................. 455/249.1; 455/250.1; 455/193.1; 455/254
(58) Field of Search .............................. 455/234.1, 249.1, 455/250.1, 254, 245.1, 193.1, 77, 150.1, 193.3, 196.1, 197.1, 232.1, 280, 299, 244.1, 296

(56) References Cited

U.S. PATENT DOCUMENTS

| | | | |
|---|---|---|---|
| 3,571,719 | * 3/1971 | Beary et al. | 455/193.3 |
| 4,186,351 | * 1/1980 | Brefini et al. | 455/226.2 |
| 4,630,117 | * 12/1986 | Parker | 455/246.1 |
| 4,862,516 | * 8/1989 | Macnak et al. | 455/193.1 |
| 5,175,883 | * 12/1992 | Ueno | 455/242.2 |
| 5,263,186 | * 11/1993 | Gornati et al. | 455/244.1 |
| 5,301,358 | * 4/1994 | Gaskill et al. | 455/193.2 |
| 5,339,453 | * 8/1994 | Sugayama et al. | 455/249.1 |
| 5,369,792 | * 11/1994 | Matsumoto et al. | 455/245.1 |
| 5,465,408 | * 11/1995 | Sugayama et al. | 455/249.1 |
| 5,722,060 | * 2/1998 | Horigome | 455/234.1 |
| 5,745,844 | * 4/1998 | Kromer et al. | 455/193.1 |

FOREIGN PATENT DOCUMENTS

| | | |
|---|---|---|
| 2 266 422 | 10/1993 | (GB) . |
| 59147546 | 8/1984 | (JP) . |
| 03297227 | 12/1991 | (JP) . |
| 05259774 | 10/1993 | (JP) . |
| WO 93 03550 | 2/1993 | (WO) . |

* cited by examiner

Primary Examiner—Dwayne Bost
Assistant Examiner—Raymond B. Persino
(74) Attorney, Agent, or Firm—Cantor Coburn LLP

(57) ABSTRACT

An antenna tuning circuit 1 is tuned to a received RF signal, and outputs a signal into an RF amplifying circuit 2 for amplification. After amplification, the circuit 2 outputs a signal to an RF tuning circuit 3, which is then tuned to the supplied signal. Since the frequency of a local oscillation signal is set according to the frequency of an object station, the RF signal of an object station is converted by a mixing circuit 4 into an IF signal having a predetermined center frequency. Also, the tuning frequency of the antenna tuning circuit 1 is adjusted to match the frequency of an object station. When disturbance stations with strong field intensity are received, field intensity of a received signal exceeds a predetermined level and a dumping control circuit 9 is activated to generate a dumping signal. In response to the dumping signal, a dumping circuit 10 is turned on, as a result of which an output signal of the antenna tuning circuit 1 is attenuated. Also, a tuning control signal is corrected so that the tuning frequency of the antenna tuning circuit 1 is prevented from being shifted away from the frequency of an object station when the dumping circuit 10 is turned on.

4 Claims, 5 Drawing Sheets

RADIO RECEIVER

BACKGROUND OF THE INVENTION

1. Field of the Invention

The present invention relates to a radio receiver comprising an antenna tuning circuit whose tuning frequency is improved.

2. Description of the Related Art

In general, when a radio receiver receives disturbance stations fud1, fud2 having a strong field intensity, in addition to an object station fd which the radio receiver desires to receive the stations fd, fud1, fud2 having frequencies different from one another by an equal extent (see FIG. 3(i)), the receiver generates various harmonic signals according to the non-linear element characteristics of an amplifying element, such as a transistor, of an RF amplifier thereof. Those harmonic signals may have frequencies corresponding to the addition or difference of the frequencies of object and disturbance stations fu, fud1, fud2.

If the frequency of such a harmonic signal is equal to that of the object station or the intermediate frequency, the harmonic signal may cause mutual modulation disturbance to the object station. FIG. 5 is a diagram showing a circuit structure of a conventional radio receiver which is less affected by mutual modulation disturbance because an antenna tuning circuit 1 is employed.

Referring to FIG. 5, a received RF signal is supplied to an antenna tuning circuit 1, which is then tuned to the object station and outputs a signal into an RF amplifier 2 for amplification. After amplification, the signal is then supplied to an RF tuning circuit 3, which is then tuned and outputs a signal into a mixing circuit 4. In the mixing circuit 4, the signal is rendered to frequency conversion using a local oscillation signal supplied by a local oscillation circuit 5 and converted into an IF (intermediate frequency) signal. The IF signal is then output to an IF amplifier 6 for amplification, and subsequently to an FM detection circuit 7 for FM detection.

It should be noted that the mixing circuit 4 supplies an IF signal also to a field strength detection circuit 8. In the circuit 8, the peak level of the supplied IF signal is detected to thereby know the field intensity of the relevant received signal. The circuit 8 then supplies a signal based on the detection result to a dumping control circuit 9. The circuit 9 in turn detects whether or not the supplied signal is higher than a predetermined level, and outputs a signal based on the detection result to a dumping circuit 10 to thereby turn on/off the dumping circuit 10.

In the above procedure, if disturbance stations fud1, fud2 having high field intensity are also received together with an object station fd, the field strength detection circuit 8 outputs a higher than a predetermined level signal. Accordingly, the dumping control circuit 9 outputs a signal a. In response to this signal a, a current flows into PIN diodes 10a and 10b in the dumping circuit 10.

When a current flows in the PIN diodes 10a and 10b, the resistance values thereof become smaller, so that the receiving line is AC grounded via the PIN diode 10a, whereby the dumping circuit 10 is turned on (ON state).

As described above, since a received RF signal is partly grounded when the dumping circuit 10 is in an ON state, an output signal level from the antenna tuning circuit 1 is attenuated, so that the subsequent RF amplifier 2 receives a reduced level signal. As a result, a harmonic signal level is reduced, and mutual modulation disturbance is resultantly suppressed, the harmonic signal being generated based on object and disturbance stations according to the non-linear characteristics of elements in the RF amplifier 2.

In addition to the above, the antenna tuning circuit 1 is adjusted to have a tuning frequency so as to match the frequency of an object station (see the solid line in FIG. 3 (i)) by thus adjusting the characteristics of a coil 1a and a capacitor 1b and the capacity of a varicap diode 1c. Specifically, the capacity of a varicap diode 1c is adjusted according to the frequency of an object station in response to a control signal generated by a control circuit 11. With this adjustment, the antenna tuning circuit 1 is tuned to the frequency of an object station and those in the vicinity thereof.

However, when the dumping circuit 10 is once turned on and a DC blocking capacitor 10c is thereby connected in parallel to the capacitor 1b and the varicap diode 1c, the tuning frequency of the antenna tuning circuit 1 is caused to be shifted toward a lower frequency side (see the dot line in FIG. 3 (i)) by an extent corresponding to the added capacity of the DC blocking capacitor 10c. In particular, if disturbance stations fud1, fus2 are present on the lower frequency side with respect to the object station fd (see FIG. 3 (i)), the level of a signal relative to an object station becomes lower than that of the disturbance fud1, fud2, when the dumping circuit 10 is turned on. Thereby, the level of a harmonic signal based on the disturbance stations fud1, fud2, is relatively increased. As a result, mutual modulation disturbance may become worse.

SUMMARY OF THE INVENTION

The present invention has been conceived to overcome the above problems and aims to provide a radio receiver capable of reducing mutual modulation disturbance caused due to operation of a dumping circuit.

In order to achieve the above object, according to a first aspect of the present invention, there is provided a radio receiver, comprising an antenna tuning circuit to be tuned to an RF signal; a dumping circuit attenuating the RF signal or an output signal from the antenna tuning circuit; an RF amplifier amplifying an output signal of the antenna tuning circuit; a dumping control circuit having the dumping circuit operate when the RF signal is at a more than predetermined level; and a corrector means removing influences of the dumping circuit over the antenna tuning circuit.

According to a second of the invention, in the radio receiver according to the first aspect, the corrector means generates a correction signal for correcting a tuning frequency of the antenna tuning circuit so as to match to a frequency of an object station when the dumping circuit is turned on.

According to a third aspect of the invention, in the radio receiver according to the second aspect, the tuning frequency of the antenna tuning circuit is corrected by a fixed extent.

According to a fourth aspect of the invention, in the radio receiver according to the second aspect, the tuning frequency of the antenna tuning circuit is corrected by an extent determined according to a frequency of object station.

According to a fifth aspect of the invention, in the radio receiver according to the fourth aspect, the tuning frequency of the antenna tuning circuit is corrected by an extent determined according to a frequency region among a number of frequency regions to which a frequency of a received object station belongs, the number of frequency regions being obtained by predivision of a frequency receiver band.

As described above, according to the present invention, when an RF signal exceeds a predetermined level and a dumping circuit is thus turned on, the tuning frequency of an antenna tuning circuit is corrected so as to be tuned to the frequency of a received object station.

BRIEF DESCRIPTION OF THE DRAWINGS

The above and other objects, features, and advantages of the present invention will become further apparent from the following description of the preferred embodiment taken in conjunction with the accompanying drawings wherein.

DESCRIPTION OF THE PREFERRED EMBODIMENT

Figure 1:
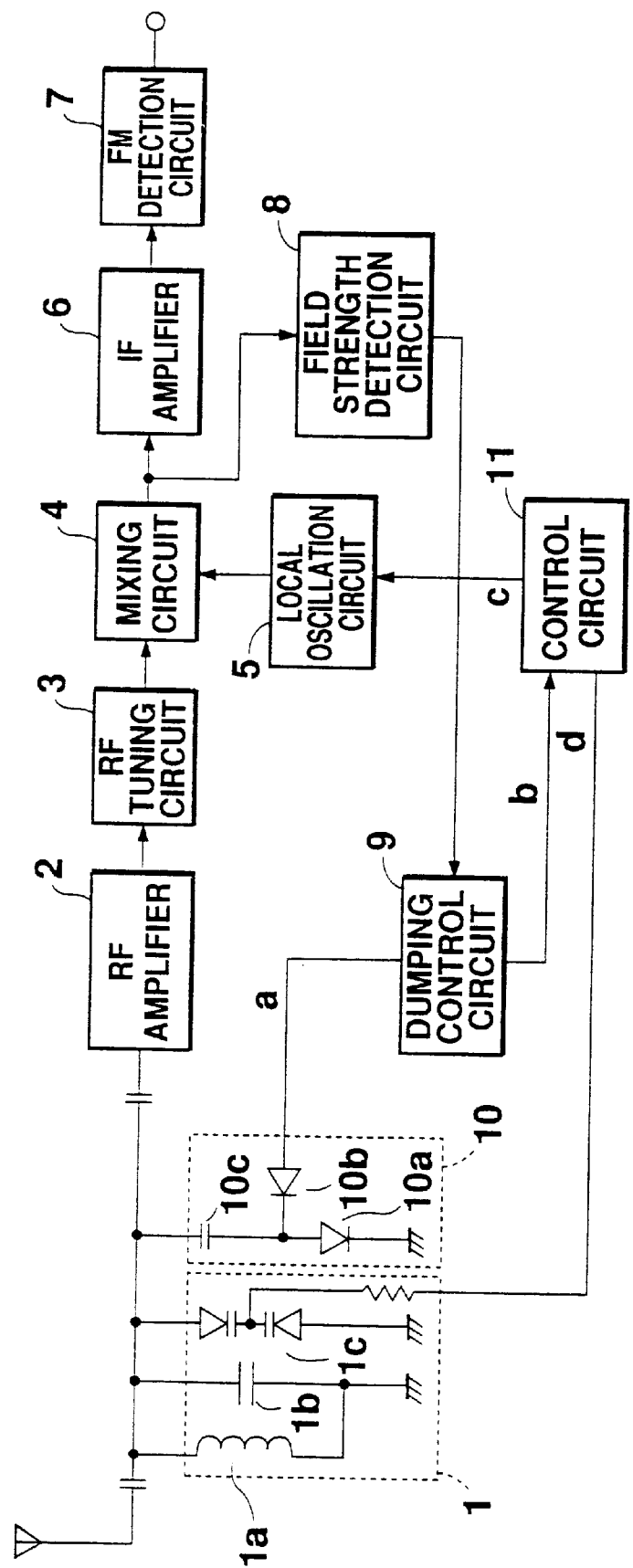
FIG. 1 is a block diagram relative to a radio receiver according to a preferred embodiment of the present invention.
Figure 5:
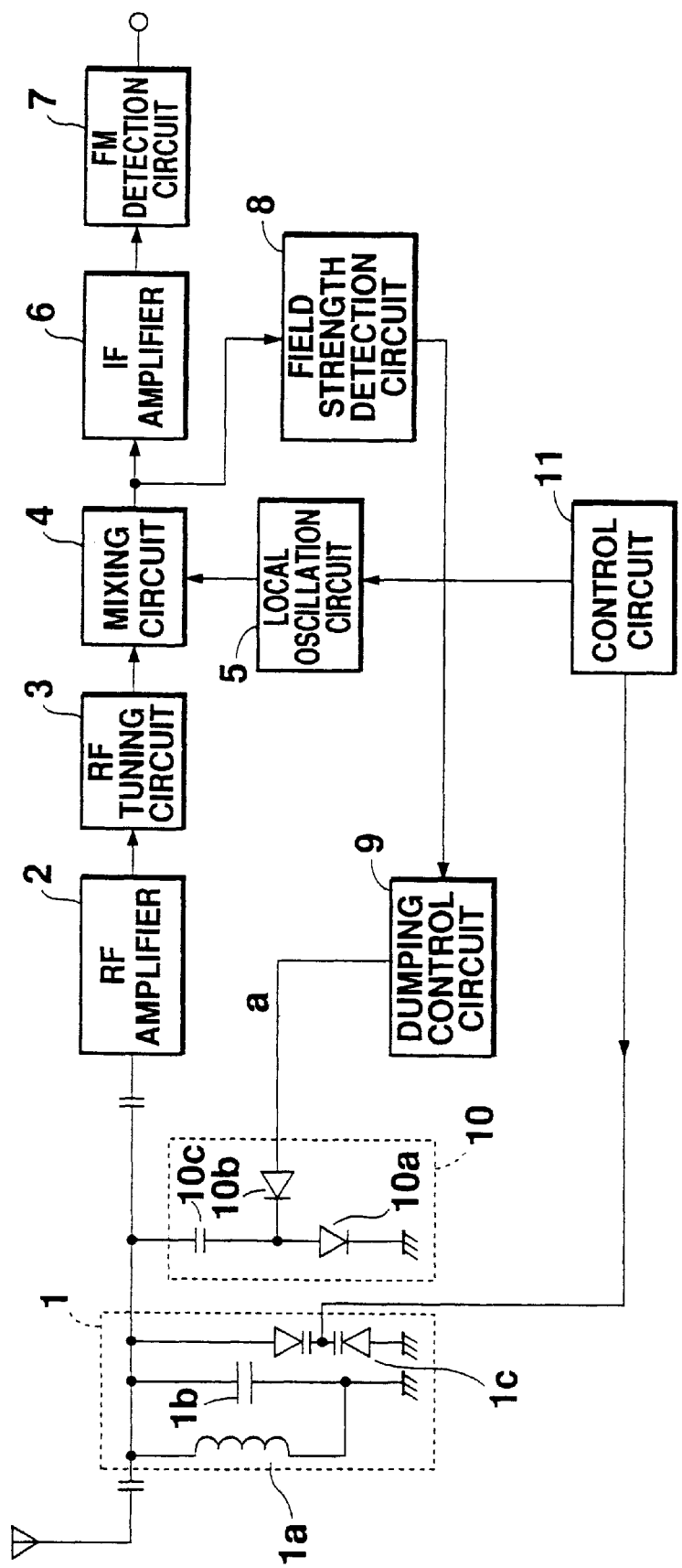
FIG. 5 is a block diagram relative to a conventional radio receiver.

FIG. 1 is a block diagram relative to a radio receiver according to the preferred embodiment of the present invention. This receiver differs from that of FIG. 5 in that an indication signal b indicating whether or not the dumping control circuit 9 is in an operating state, is supplied to the control circuit 11.

Figure 2:
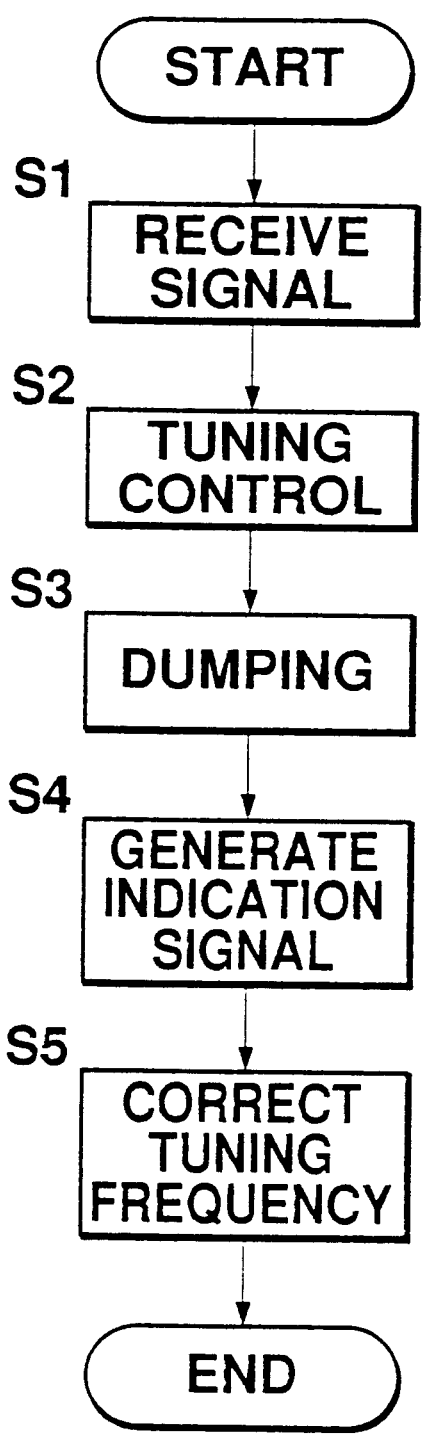
FIG. 2 is a flowchart of an operation of the circuit of FIG. 1.

The operation of the circuit of FIG. 1 when it receives both an object station fu and disturbance stations fud1, fud2 (see FIG. 3 (ii)) will be described with reference to the flowchart of FIG. 2.

The radio receiver initially receives an object station. That is, the control circuit 11 supplies a local oscillation control signal c corresponding to the frequency of an object station to the local oscillation circuit 5. In response to this signal, the local oscillation circuit 5 sets a local oscillation signal to have such a frequency that enables conversion of an object station signal into an IF signal at 10.7 MHz or such like. With this arrangement, an RF signal of an object station alone is converted to an IF signal, and then detected by the FM detection circuit 7 (S1).

In addition, the control circuit 11 calculates the frequency of the object station to be received based on the local oscillation control signal c, and generates a tuning control signal d corresponding to the calculated received frequency. The circuit 11 then supplies the tuning control signal d to the antenna tuning circuit 1, and the tuning frequency of the antenna tuning circuit 1 is adjusted to the frequency of the object station (see the solid line in FIG. 3 (i)) (S2).

Figure 3:
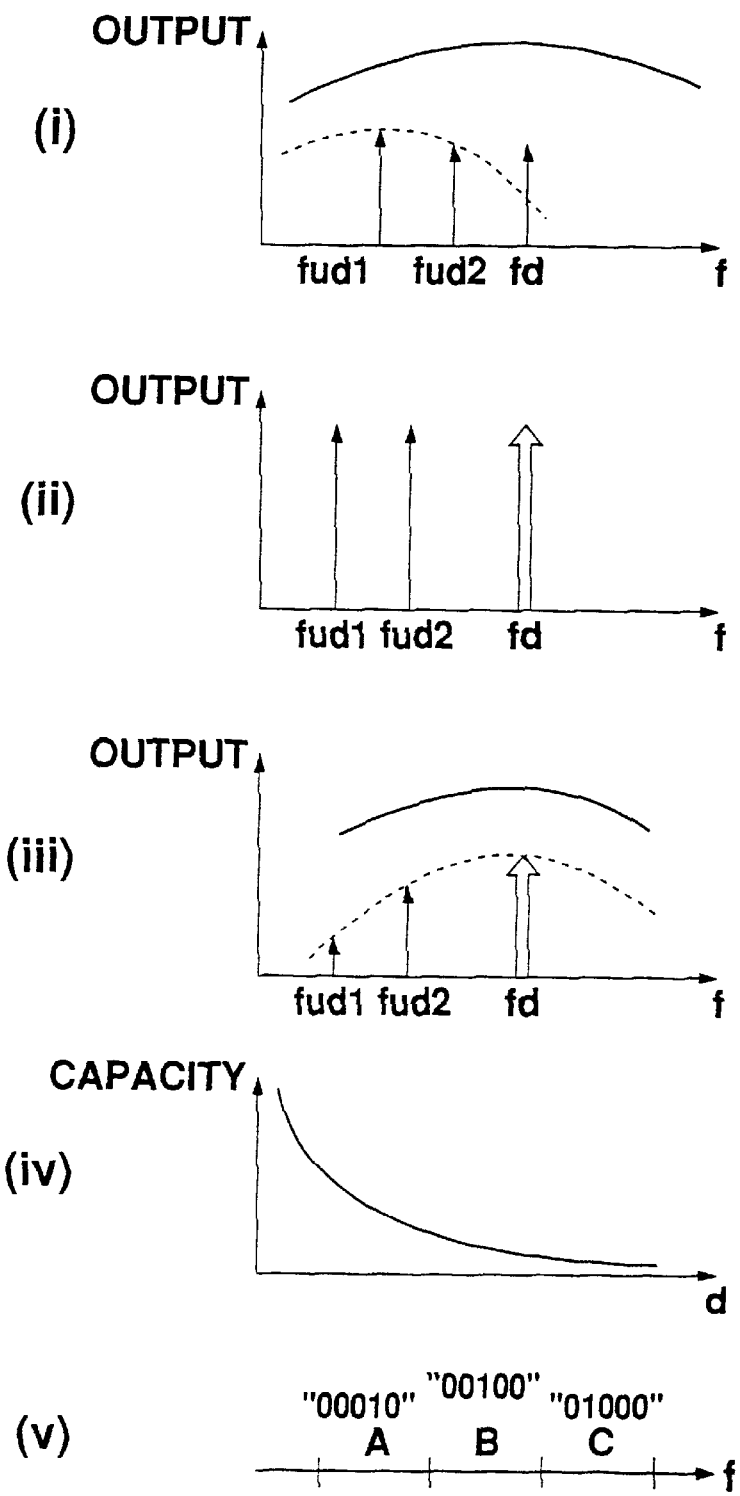
FIG. 3 is a diagram showing characteristics of an illustrative operation of the present invention.

In the above procedure, if disturbance stations fud1, fud2 having strong field intensity are present in the vicinity of the frequency of an object station fd (see FIG. 3 (ii)), the disturbance stations are also received by the receiver and transmitted to the mixing circuit 4, as their frequencies are close to each other. Upon this, the mixing circuit 4 outputs a signal at an increased level, and the field strength detection circuit 8 also outputs a signal at an increased level.

As the output signal level of the circuit 8 is higher than a predetermined level, the dumping control circuit 9 outputs a dumping signal a to the dumping circuit 10 to thereby turn on the circuit 10. As a result, the output signal level from the antenna tuning circuit 1 is attenuated, and the harmonic signal is also reduced (S3) as the harmonic signal is generated based on the object and disturbance stations according to the non-linear characteristics of an element in the RF amplifier circuit 2, and the like.

Besides signal a, the dumping control circuit 9 generates an indication signal b notifying dumping occurred, and supplies it to the control circuit 11 (S4). In response to the signal b, the control circuit 11 adjusts a tuning control signal d by increasing the level thereof by a predetermined extent. Specifically, data "00100" is added to a tuning control signal d in the form of a digital signal (S5). The tuning control signal d is generated as, for example, a five-bit digital signal and then converted into an analog signal in the control circuit 11.

With correction to a tuning control signal d, the capacity of the varicap diode 1c is reduced. Then, tuning frequency of the circuit 1 is increased, the frequency being based on the coil 1a, the capacitor 1b, the varicap diode 1c, and the capacitor 10c connected in parallel to them by ON state of the dumping circuit 10. The drop in the capacity of the varicap diode 1c cancels off the increase of the total capacity with the parallel capacitor 10c, so that the tuning frequency of the antenna tuning circuit 1 is corrected to match the frequency of the object station.

The antenna tuning circuit 1 and the dumping circuit 10 combined present output characteristics indicated by the dotted line curve in FIG. 3 (iii). These characteristics are obtained from those indicated by the solid line in FIG. 3 (iii) in which dumping is not carried out, by largely attenuating an output signal of the antenna tuning circuit 1 without causing a shift of the antenna tuning frequency of the antenna tuning circuit 1. In other words, as is obvious from FIG. 3 (iii), attenuation of disturbance stations only is achievable when the dumping circuit 10 is in an ON state, without attenuating the signal level of an object station. As described above, the control circuit 11 serves as a corrector means according to the present invention.

In addition to the above, when the receiver receives only an object station, but are having a strong field intensity, the dumping control circuit 9 also outputs a dumping signal a and an indication signal b in response to a signal from the field strength detection circuit 8. This provokes the dumping circuit 10 to operate, as a result of which a received RF signal is attenuated, similar to the above, so that saturation of the RF amplifier can be prevented.

Also, since the control circuit 11 corrects a tuning control signal d, the tuning frequency of the antenna tuning circuit 1 is thereby corrected so as to accord with the frequency of an object station. With this correction, the output signal level of the antenna tuning circuit 1 is largely attenuated, so that the antenna tuning circuit 1 and the dumping circuit 10 combined present output characteristics indicated by the dotted line in FIG. 3 (iii). Resultantly, the antenna tuning frequency of the circuit 1 is well tuned to the frequency of an object station.

It should be noted that although it has been described that a tuning control signal d is corrected by a fixed extent in the above, the signal d may be corrected by an extent determined depending on a received frequency. That is, since the capacity of a varicap diode 1c has non-linear characteristics inversely proportional to a tuning control signal d, that is, the capacity of a varicap diode 1c is decreased as a tuning control signal d is increased (see FIG. 3(iv)) the ratio between a changed amount of the capacity of the varicap diode 1c and that of the level of a tuning control signal d, may vary depending on the frequency to which the antenna tuning circuit 1 is tuned. Therefore, a correction extent for a tuning control signal d may differ depending on the frequency of an object station in order to achieve precise correction to the tuning frequency of the antenna tuning circuit 1.

Figure 4:
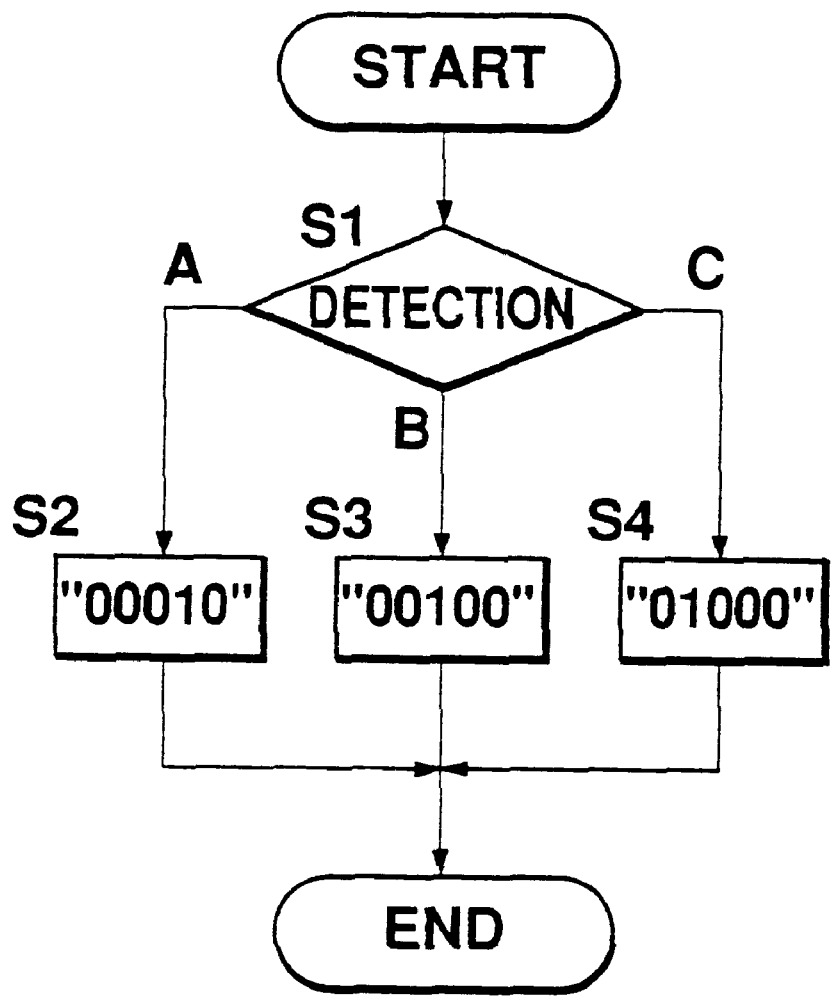
FIG. 4 is a flowchart of another operation of the circuit of FIG. 1.

This correction may be achieved as follows. Referring to the flowchart of FIG. 4, the frequency of a receiver band is divided into, for instance, three regions (see FIG. 3 (v)), and the control circuit 11 detects to which divided frequency region the frequency of a received object station belongs (S1). Then, a tuning control signal d is corrected by an extent corresponding to the divided frequency region to which the received frequency belongs. For example, a tuning control signal d is corrected with data "00010" if the frequency of a received object station belongs to an A region (S2); data "00100" for the B region (S3); and data "01000" for the C region (S4). In this manner, a tuning control signal d is corrected by an appropriate correction extent.

It should also be noted that, although an output signal of the mixing circuit 4 is used in detection of the field intensity of object and disturbance stations in the above, an output signal of the RF tuning circuit 3 or an input signal of the mixing circuit 4 may instead be used for detection.

As described above, according to the present invention, the tuning frequency of the antenna tuning circuit is corrected to match the frequency of an object station when the dumping circuit is operated. With this arrangement, when the receiver receives disturbance station with a strong field intensity, in addition to an object station, the disturbance station is attenuated by means of dumping, so that mutual modulation disturbance can be prevented.

Also, since the correction extent for the tuning frequency of an antenna tuning circuit is determined based on the frequency of an object station in accordance with the characteristics of a tuning element of the antenna tuning circuit, the tuning frequency of the antenna tuning circuit can be precisely corrected so as to accord with the frequency of an object station.

While there has been described what are at present considered to be a preferred embodiment of the invention, it will be understood that various modifications may be made thereto, and it is intended that the appended claims cover all such modifications as fall within the true spirit and scope of the invention.

What is claimed is:

1. A radio receiver, comprising:

an antenna tuning circuit to be tuned to an RF signal;

a dumping circuit attenuating the RF signal or an output signal from the antenna tuning circuit;

an RF amplifier amplifying an output signal of the antenna tuning circuit;

a dumping control circuit having the dumping circuit operate when the RF signal is at a more than predetermined level; and a corrector means removing influences of the dumping circuit on the antenna tuning circuit;

wherein the corrector means generates a correction signal for correcting a tuning frequency of the antenna tuning circuit so as to match to a frequency of an object station when the dumping circuit is tuned on.

2. A radio receiver according to claim 1, wherein the tuning frequency of the antenna tuning circuit is corrected by a fixed extent.

3. A radio receiver according to claim 1, wherein the tuning frequency of the antenna tuning circuit is corrected by an extent determined according to a frequency of object station.

4. A radio receiver according to claim 3, wherein the tuning frequency of the antenna tuning circuit is corrected by an extent determined according to a frequency region among a number of frequency regions, to which a frequency of a received object station belongs, the number of frequency regions being obtained by dividing a frequency receiver band beforehand.

* * * * *